(12) United States Patent
Nakata et al.

(10) Patent No.: US 11,887,933 B2
(45) Date of Patent: Jan. 30, 2024

(54) MANUFACTURING METHOD OF SEMICONDUCTOR DEVICE

(71) Applicant: Mitsubishi Electric Corporation, Tokyo (JP)

(72) Inventors: Yosuke Nakata, Tokyo (JP); Yuji Sato, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 159 days.

(21) Appl. No.: 17/501,598

(22) Filed: Oct. 14, 2021

(65) Prior Publication Data

US 2022/0302036 A1 Sep. 22, 2022

(30) Foreign Application Priority Data

Mar. 19, 2021 (JP) ................................. 2021-045845

(51) Int. Cl.
*H01L 23/538* (2006.01)
*H01L 23/00* (2006.01)
*H01L 23/10* (2006.01)

(52) U.S. Cl.
CPC .......... *H01L 23/5385* (2013.01); *H01L 23/10* (2013.01); *H01L 23/5386* (2013.01); *H01L 24/04* (2013.01); *H01L 24/96* (2013.01)

(58) Field of Classification Search
CPC . H01L 25/5385; H01L 23/10; H01L 23/5386; H01L 24/04; H01L 24/96
See application file for complete search history.

(56) References Cited

U.S. PATENT DOCUMENTS

| | | | | |
|---|---|---|---|---|
| 9,899,345 | B2 * | 2/2018 | Fujino | .................... H01L 25/072 |
| 2011/0298115 | A1 * | 12/2011 | Celaya | .............. H01L 23/49575 257/784 |
| 2013/0154123 | A1 * | 6/2013 | Poh | ...................... H01L 23/4334 257/782 |
| 2013/0256920 | A1 * | 10/2013 | Sugimura | ............... H01L 23/48 257/777 |
| 2013/0307132 | A1 * | 11/2013 | Kawabata | ......... H01L 23/49541 257/676 |
| 2014/0110788 | A1 * | 4/2014 | Cho | ................... H01L 23/49575 257/368 |

(Continued)

FOREIGN PATENT DOCUMENTS

WO 2020-110170 A1 6/2020

*Primary Examiner* — Nathan W Ha
(74) *Attorney, Agent, or Firm* — Studebaker & Brackett PC

(57) ABSTRACT

A semiconductor chip including a main electrode and a control electrode is bonded to a substrate. A wiring chip including a first electrode, a second electrode and a wiring is bonded to the substrate. A main electrode member is bonded to the main electrode. A control electrode member is bonded to the second electrode. The control electrode is bonded to the first electrode with a connection member. The semiconductor chip, the substrate, the wiring chip, the main electrode member, the control electrode member and the connection member are putted into a mold and are sealed with sealing material by injecting the sealing material into the mold in a state that distal end surfaces of the main electrode member and the control electrode member are pressed against a buffer material provided between the main electrode member/the control electrode member and the mold. The sealing material is not ground.

16 Claims, 8 Drawing Sheets

(56) References Cited

U.S. PATENT DOCUMENTS

| | | | | |
|---|---|---|---|---|
| 2014/0167237 A1* | 6/2014 | Yoo | ............... | H01L 24/73 |
| | | | | 257/676 |
| 2015/0103498 A1* | 4/2015 | Lee | ............... | H01L 23/49811 |
| | | | | 361/728 |
| 2016/0005703 A1* | 1/2016 | Nakata | ............... | H01L 24/83 |
| | | | | 257/779 |
| 2017/0125333 A1* | 5/2017 | Tomizawa | ............... | H01L 23/3128 |
| 2017/0148770 A1* | 5/2017 | Ishino | ............... | H01L 23/3121 |
| 2017/0194296 A1* | 7/2017 | Yasui | ............... | H01L 24/85 |
| 2019/0035770 A1* | 1/2019 | Iguchi | ............... | H01L 23/3121 |
| 2019/0131210 A1* | 5/2019 | Hino | ............... | H01L 24/48 |
| 2019/0326193 A1* | 10/2019 | Nakata | ............... | H01L 21/31111 |
| 2020/0126947 A1* | 4/2020 | Karasawa | ............... | H01L 25/162 |
| 2021/0125904 A1* | 4/2021 | Sugimachi | ............... | H01L 23/4334 |
| 2021/0193581 A1* | 6/2021 | Seo | ............... | H01L 23/5384 |
| 2021/0265175 A1* | 8/2021 | Lee | ............... | H01L 23/49844 |
| 2021/0287968 A1* | 9/2021 | Tanaka | ............... | H01L 25/072 |
| 2021/0351092 A1* | 11/2021 | Hiyoshi | ............... | H01L 23/13 |
| 2021/0351161 A1* | 11/2021 | Iguchi | ............... | H01L 25/0655 |
| 2021/0375783 A1* | 12/2021 | Chiu | ............... | H01L 25/16 |
| 2022/0028839 A1* | 1/2022 | Nakata | ............... | H01L 24/26 |
| 2022/0093538 A1* | 3/2022 | Chiu | ............... | H01L 23/13 |
| 2022/0093552 A1* | 3/2022 | Takeda | ............... | H01L 24/32 |
| 2022/0199502 A1* | 6/2022 | Prajuckamol | ............... | H01L 23/49562 |
| 2022/0238413 A1* | 7/2022 | Grassmann | ............... | H01L 23/367 |
| 2022/0238476 A1* | 7/2022 | Nakata | ............... | H01L 25/0655 |

* cited by examiner

MANUFACTURING METHOD OF SEMICONDUCTOR DEVICE

BACKGROUND OF THE INVENTION

Field

The present disclosure relates to a manufacturing method of a semiconductor device.

Background

In a module using a SiC MOSFET, a plurality of chips need to be connected in parallel to increase current capacity, because an area of the SiC MOSFET is difficult to be increased. A semiconductor device in which a plurality of semiconductor chips and a wiring chip are bonded to a substrate and control electrodes of the respective semiconductor chips are connected in parallel in a circuit pattern in the wiring chip has been proposed (see, for example, WO2020/110170). Main electrode members are bonded to main electrodes of the plurality of semiconductor chips, control electrode members are bonded to the circuit pattern in the wiring chip, and the semiconductor device is sealed with a resin.

SUMMARY

In related art, a sealing material is ground to expose electrode members from the sealing material. However, there is a problem that dust is generated in grinding process, and moisture enters from a ground surface in a case of wet grinding. Further, in grinding, electrode members are ground more than necessary due to variation in heights of the electrode members, which causes a problem of wasting a material and a machining period and making it difficult to detect an end. Further, grinding itself involves machining cost.

The present disclosure has been made to solve the problem as described above, and an object of the present disclosure is to provide a manufacturing method of a semiconductor device which is capable of reliably leading electrode members out of an upper surface of the device while preventing increase in manufacturing cost.

A manufacturing method of a semiconductor device according to the present disclosure includes: bonding a semiconductor chip, which includes a main electrode and a control electrode, to a substrate; bonding a wiring chip, which includes a first electrode, a second electrode and a wiring connecting the first electrode and the second electrode, to the substrate; bonding a main electrode member to the main electrode via a first bonding material; bonding a control electrode member to the second electrode via a second bonding material; bonding the control electrode to the first electrode with a connection member; putting the semiconductor chip, the substrate, the wiring chip, the main electrode member, the control electrode member and the connection member, which are bonded, into a mold; and sealing the semiconductor chip, the substrate, the wiring chip, the main electrode member, the control electrode member and the connection member with sealing material by injecting the sealing material into the mold in a state that distal end surfaces of the main electrode member and the control electrode member are pressed against a buffer material provided between the main electrode member and the mold and between the control electrode member and the mold, wherein the sealing material is not ground.

In the present disclosure, even if the heights of the control electrode member and the main electrode member vary and a gap is generated between the main electrode member and the control electrode member, and the mold, the buffer material fills the gap. Thus, the distal end surfaces of the main electrode member and the control electrode member are exposed without being covered with the sealing material in the sealing process, and thus, the sealing material is not ground after the sealing process. It is therefore possible to reliably lead the electrode members out of the upper surface of the device while preventing increase in manufacturing cost.

Other and further objects, features and advantages of the invention will appear more fully from the following description.

DESCRIPTION OF EMBODIMENTS

A manufacturing method of a semiconductor device according to the embodiments of the present disclosure will be described with reference to the drawings. The same components will be denoted by the same symbols, and the repeated description thereof may be omitted.

First Embodiment

Figure 1:
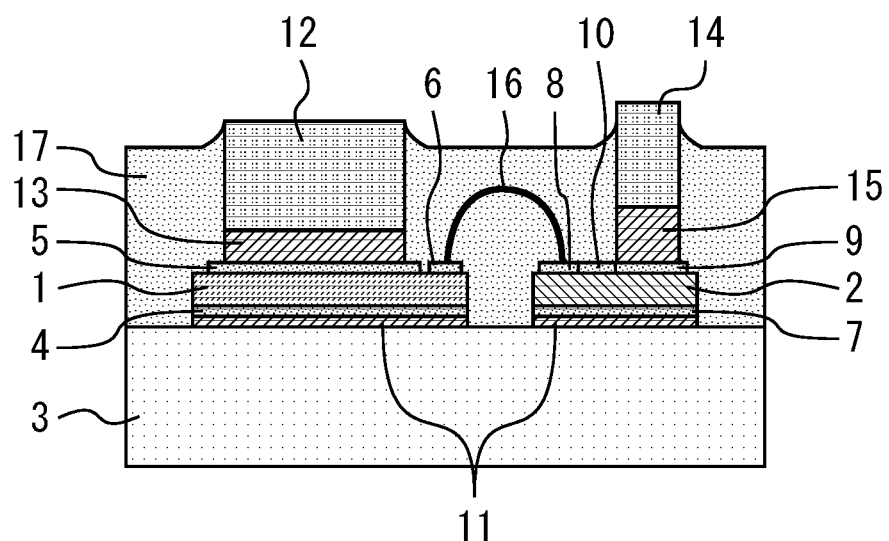
FIG. 1 is a cross-sectional view illustrating a semiconductor device according to a first embodiment.

FIG. 1 is a cross-sectional view illustrating a semiconductor device according to a first embodiment. A plurality of semiconductor chips 1 and one wiring chip 2 are bonded to a substrate 3. The semiconductor chip 1 includes a backside electrode 4 on a back side, and a main electrode 5 and a control electrode 6 on a front side. The semiconductor chip 1 is, for example, a MOSFET. The control electrode 6 is, for example, a gate electrode or a Kelvin source electrode. In a case where the semiconductor chip 1 incorporates a temperature sensing device or a current sensing device, the semiconductor chip 1 further includes control electrodes which respectively correspond to the temperature sensing device and the current sensing device.

The backside electrode 4 is, for example, a metal film in which a silicide layer, a titanium layer, a nickel layer, a titanium layer and a gold or silver layer are stacked in this order from the semiconductor chip 1 side using a sputtering method. The main electrode 5 and the control electrode 6 are, for example, metal films in which an aluminum layer is formed on the semiconductor chip 1 using a sputtering method, and a nickel layer, a palladium layer and a gold layer are stacked on the aluminum layer using a plating method. Alternatively, the main electrode 5 and the control electrode 6 may be metal films in which an aluminum layer, a titanium layer, a nickel layer, a titanium layer and a gold or silver layer are stacked using a sputtering method. Other than these films, a stacked film having similar functions may be selected.

The wiring chip 2 includes a bonding layer 7 on a back side, and a first electrode 8, a second electrode 9 and a wiring 10 which connects the first electrode 8 and the second electrode 9 on a front side. The wiring chip 2 is, for example, a device formed with silicon, an insulating film such as an oxide film is formed on an Si surface, and the first electrode 8, the second electrode 9 and the wiring 10 are formed on the insulating film. The first electrode 8, the second electrode 9 and the wiring 10 are, for example, a wiring pattern formed with aluminum. A metal layer which can be bonded is provided on at least the second electrode 9. A similar metal layer may also be provided on the first electrode 8. The metal layer which can be bonded is, for example, a stacked metal film which is similar to the main electrode 5 of the semiconductor chip 1. The bonding layer 7 is, for example, a metal film which is similar to the backside electrode 4 of the semiconductor chip 1. The backside electrode 4 of the semiconductor chip 1 and the bonding layer 7 of the wiring chip 2 are respectively bonded to the substrate 3 via a bonding material 11.

A main electrode member 12 is bonded to the main electrode 5 of the semiconductor chip 1 via a first bonding material 13. The main electrode member 12 is, for example, formed with copper. In a case where the main electrode member 12 is provided over main electrodes 5 of a plurality of semiconductor chips 1, portions bonded to the main electrodes 5 protrude, and portions which connect the bonded portions are thinner than the portions bonded to the main electrodes 5. This enables the main electrodes 5 of the plurality of semiconductor chips 1 to be connected at the same potential while avoiding a peripheral withstand voltage structure of the semiconductor chip 1. Alternatively, it is also possible to employ a configuration where the main electrodes 5 of the plurality of semiconductor chips 1 are independent of each other, and the main electrodes 5 have the same potential when the main electrodes 5 are connected to an external electrode.

A control electrode member 14 is bonded to the second electrode 9 of the wiring chip 2 via a second bonding material 15. The control electrode member 14 is, for example, a plurality of blocks formed with copper.

The control electrode 6 of each of the plurality of semiconductor chips 1 is connected to the first electrode 8 of the wiring chip 2 with a connection member 16. The connection member 16 is, for example, a wire formed with gold, silver or aluminum. It is possible to reduce a dimension of the control electrode 6 of the semiconductor chip 1 by using a small-diameter wire formed with gold or silver. It is therefore possible to increase an effective area and reduce manufacturing cost of the semiconductor chip 1.

The semiconductor chip 1, an upper surface of the substrate 3, the wiring chip 2, the main electrode member 12, the control electrode member 14 and the connection member 16 are sealed with a sealing material 17. The sealing material 17 is, for example, an epoxy resin mixed with filler. Distal end portions of the main electrode member 12 and the control electrode member 14 protrude from an upper surface of the sealing material 17, and distal end surfaces are exposed from the sealing material 17.

Figure 2:
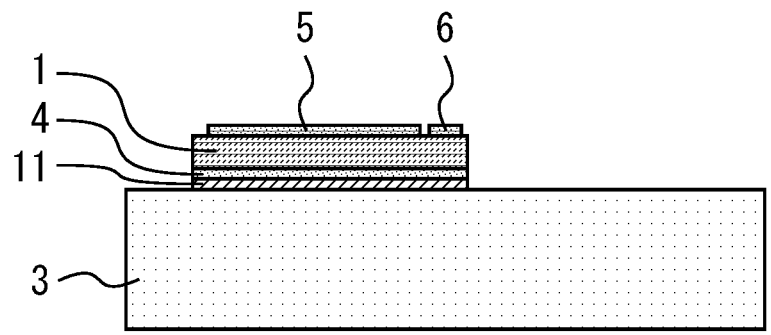
FIG. 2 is a cross-sectional view illustrating a manufacturing method of a semiconductor device according to the first embodiment.
Figure 3:
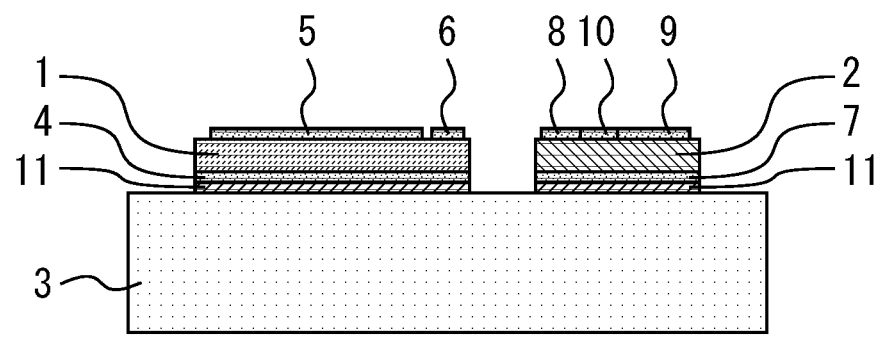
FIG. 3 is a cross-sectional view illustrating a manufacturing method of a semiconductor device according to the first embodiment.

Subsequently, a manufacturing method of the semiconductor device according to the present embodiment will be described. FIGS. 2 to 7 are cross-sectional views illustrating a manufacturing method of a semiconductor device according to the first embodiment. First, as illustrated in FIG. 2, the semiconductor chip 1 is bonded to the substrate 3. Then, as illustrated in FIG. 3, the wiring chip 2 is bonded to the substrate 3. In this event, the backside electrode 4 of the semiconductor chip 1 and the bonding layer 7 of the wiring chip 2 are respectively bonded to the substrate 3 via the bonding material 11. The bonding material 11 may be, for example, solder, or bonding may be achieved through sinter bonding using a bonding material formed with silver or copper. The sinter bonding may be pressure bonding in which a temperature is increased while the semiconductor chip 1 and the wiring chip 2 are pressed from upper surfaces of the electrodes, or may be pressure-less bonding in which a pressure is not applied. Alternatively, the wiring chip 2 may be bonded using an adhesive agent, or the like, which can obtain thermomechanical stability by being heated. However, in a case where the wiring chip 2 formed with silicon is used, there is a case where the wiring chip 2 breaks, and thus, a bonding method in which a pressure is not applied is preferable.

Figure 4:
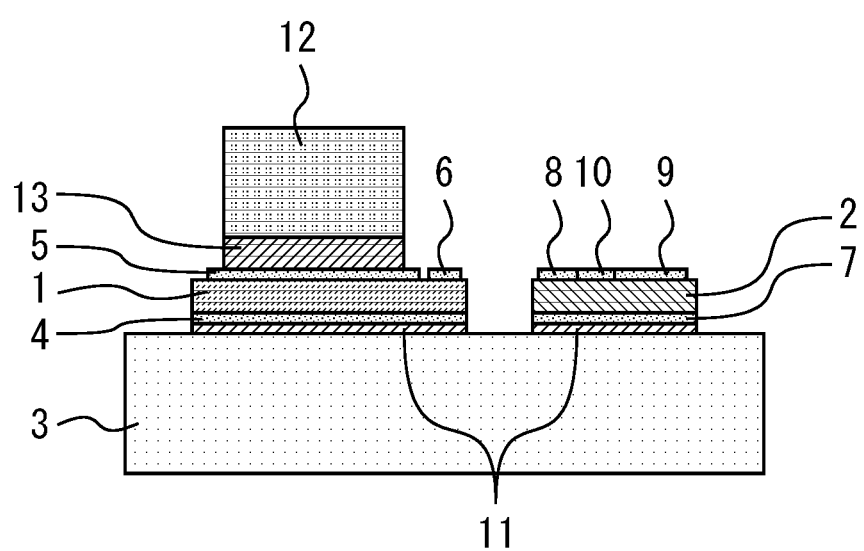
FIG. 4 is a cross-sectional view illustrating a manufacturing method of a semiconductor device according to the first embodiment.
Figure 5:
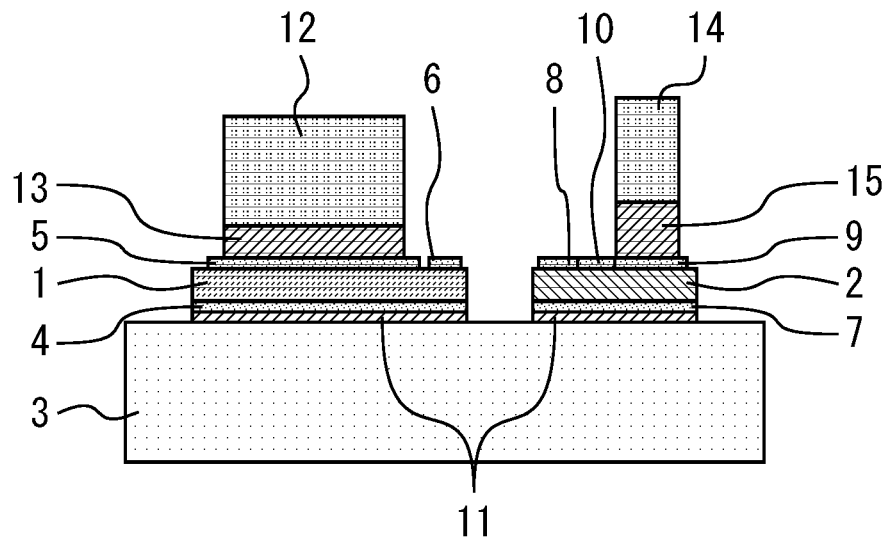
FIG. 5 is a cross-sectional view illustrating a manufacturing method of a semiconductor device according to the first embodiment.

Then, as illustrated in FIG. 4, the main electrode member 12 is bonded to the main electrode 5 via the first bonding material 13. Then, as illustrated in FIG. 5, the control electrode member 14 is bonded to the second electrode 9 via the second bonding material 15. The first bonding material 13 and the second bonding material 15 may be, for example, solder, or bonding may be achieved through sinter bonding using a bonding material formed with silver or copper. Although the sinter bonding may be pressure bonding in which a temperature is increased while the electrodes are pressed from upper surfaces of the electrodes, pressure-less bonding in which a pressure is not applied is preferable.

The thicknesses of the main electrode member 12 and the control electrode member 14 vary due to variation in manufacturing tolerance of the main electrode member 12 and the control electrode member 14. Further, thicknesses of the first bonding material 13 and the second bonding material 15 also vary. Thus, a height of a distal end surface of the bonded main electrode member 12 is different from a height of a distal end surface of the bonded control electrode member 14.

Figure 6:
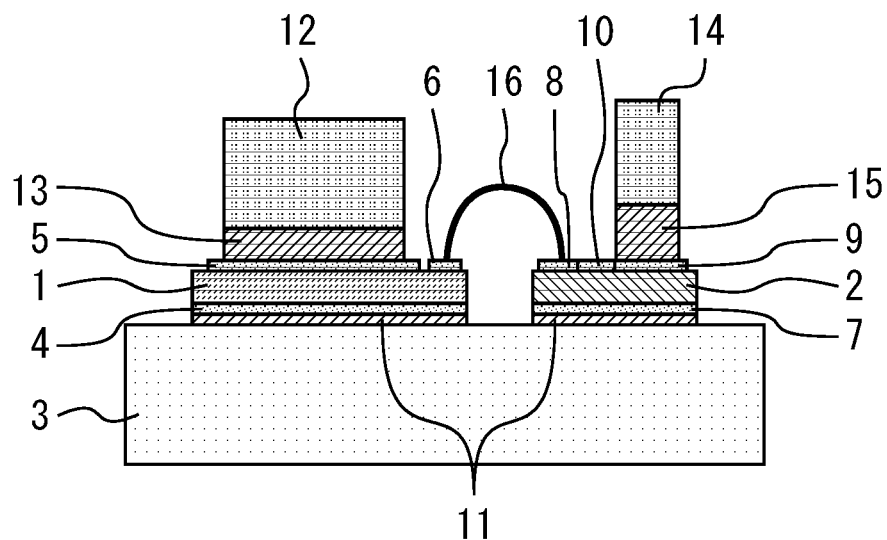
FIG. 6 is a cross-sectional view illustrating a manufacturing method of a semiconductor device according to the first embodiment.
Figure 7:
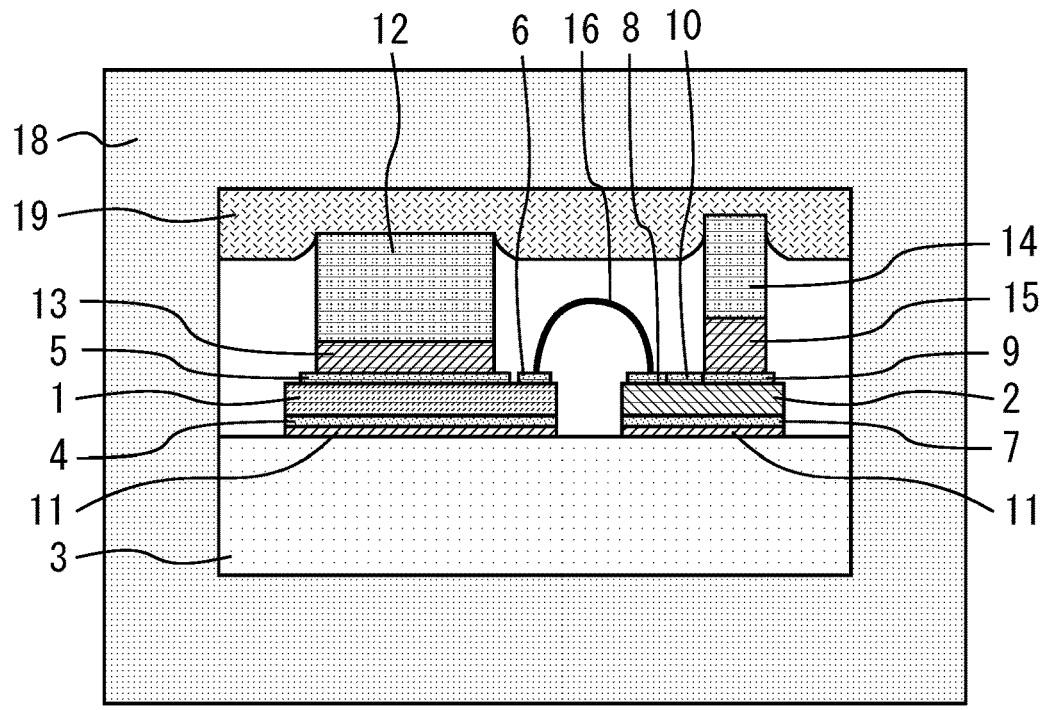
FIG. 7 is a cross-sectional view illustrating a manufacturing method of a semiconductor device according to the first embodiment.

Then, as illustrated in FIG. 6, the control electrode 6 is bonded to the first electrode 8 with the connection member 16. Then, as illustrated in FIG. 7, a semi-finished product including the semiconductor chip 1, the substrate 3, the wiring chip 2, the main electrode member 12, the control electrode member 14 and the connection member 16, which are bonded, is put into a mold 18. In this event, a buffer material 19 is provided between the main electrode member 12 and the mold 18 and between the control electrode member 14 and the mold 18.

When the distal end surfaces of the main electrode member 12 and the control electrode member 14 are pressed against the buffer material 19, thicknesses of portions of the buffer material 19, which contact the main electrode member 12 and the control electrode member 14 become thin by pressing force. In a case where the height of the distal end surface of the main electrode member 12 is different from the height of the distal end surface of the control electrode member 14, a thickness of a portion of the buffer material 19, which contacts the main electrode member 12 is different from a thickness of a portion which contacts the control electrode member 14. The semiconductor chip 1, the upper surface of the substrate 3, the wiring chip 2, the main electrode member 12, the control electrode member 14 and the connection member 16 are sealed with the sealing material 17 using a transfer molding sealing method in which the sealing material 17 is injected into the mold 18 in this state.

The buffer material 19 is removed from the upper surface of the semiconductor device when the semiconductor device is removed from the mold 18 after sealing. Through the above-described process, the semiconductor device in which the distal end surfaces of the main electrode member 12 and the control electrode member 14 are exposed from the sealing material 17 is manufactured without grinding the sealing material 17.

Further, it is possible to constitute a higher-order semiconductor device such as a half-bridge circuit and a full-bridge circuit by using a plurality of manufactured semiconductor devices. In this case, the substrate 3 is electrically or thermally connected to a drain circuit pattern through solder bonding or sinter bonding. The main electrode member 12 is electrically connected to a source circuit pattern through wire bonding, ribbon bonding or solder bonding of a lead frame. Thereafter, a higher-order semiconductor device is manufactured by covering the periphery of the semiconductor device and the circuit patterns with a secondary sealing material such as gel. Note that in a case where solder is used as a bonding material of the semiconductor chip 1, it is preferable to use solder having a melting point higher than a bonding process temperature when the higher-order semiconductor device is assembled.

Figure 8:
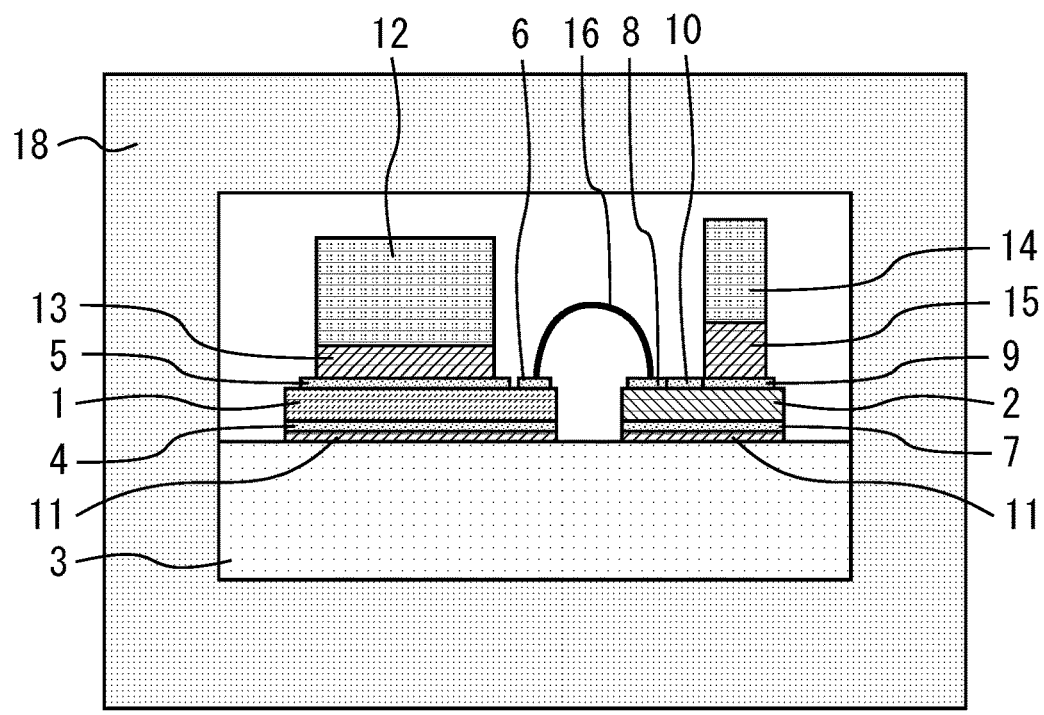
FIG. 8 is a cross-sectional view illustrating a manufacturing method of a semiconductor device according to the comparative example.
Figure 9:
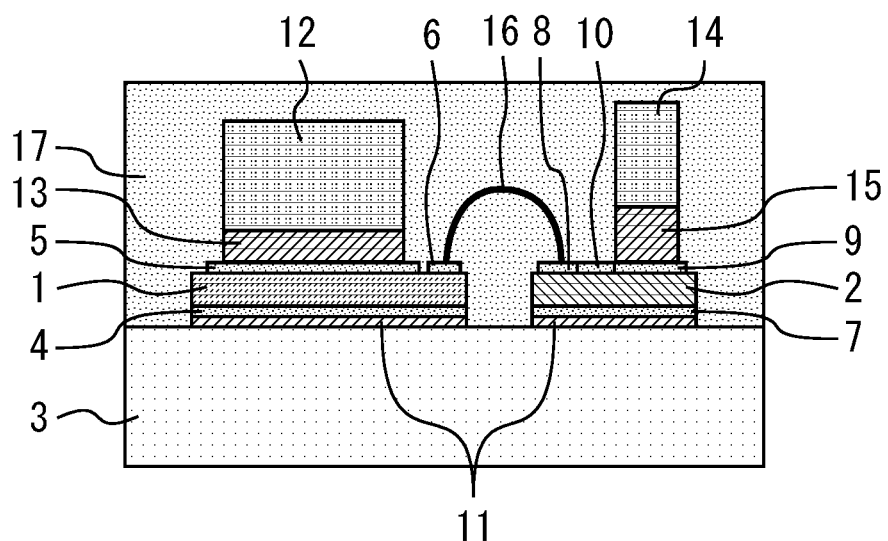
FIG. 9 is a cross-sectional view illustrating a manufacturing method of a semiconductor device according to the comparative example.
Figure 10:
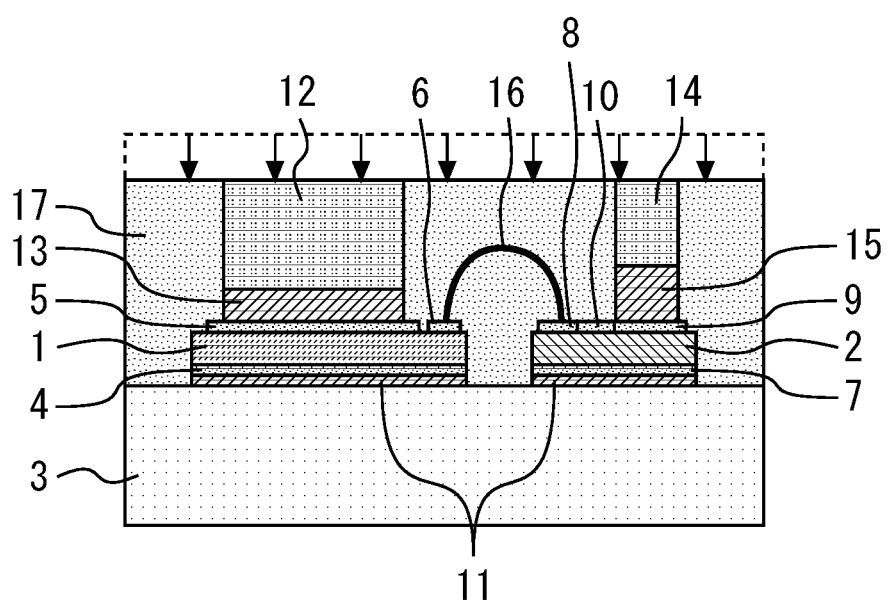
FIG. 10 is a cross-sectional view illustrating a manufacturing method of a semiconductor device according to the comparative example.

Subsequently, effects of the present embodiment will be described while being compared with a comparative example. FIGS. 8 to 10 are cross-sectional views illustrating a manufacturing method of a semiconductor device according to the comparative example. In the comparative example, as illustrated in FIG. 8, the buffer material 19 is not used in resin sealing process. Thus, a gap is generated between the mold 18 and the main electrode member 12 and between the mold 18 and the control electrode member 14, and the sealing material 17 goes into the gap. Thus, as illustrated in FIG. 9, there is a case where the main electrode member 12 or the control electrode member 14 cannot be exposed from the surface of the sealing material 17. Thus, as illustrated in FIG. 10, it is necessary to grind the extra sealing material 17 and parts of the main electrode member 12 and the control electrode member 14 to expose the main electrode member 12 and the control electrode member 14.

In contrast, in the present embodiment, even if the heights of the control electrode member 14 and the main electrode member 12 vary and a gap is generated between the main electrode member 12 and the mold 18 and between the control electrode member 14 and the mold 18, the buffer material 19 fills the gap. Thus, the distal end surfaces of the main electrode member 12 and the control electrode member 14 are exposed without being covered with the sealing material 17 in the sealing process, and thus, the sealing material 17 is not ground after the sealing process. It is therefore possible to reliably lead the electrode members out of the upper surface of the device while preventing increase in manufacturing cost.

Figure 11:
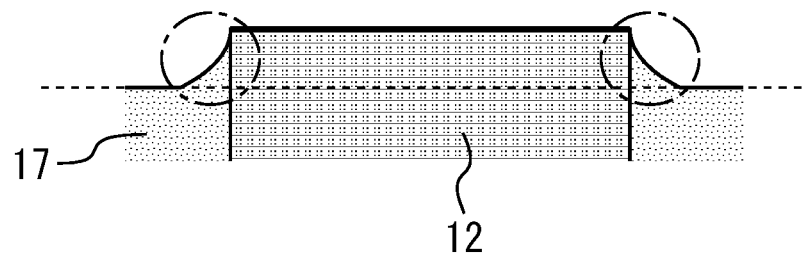
FIG. 11 is a cross-sectional view illustrating a distal end portion of the main electrode member after sealing.

FIG. 11 is a cross-sectional view illustrating a distal end portion of the main electrode member after sealing. When the distal end surfaces of the main electrode member 12 and the control electrode member 14 are pressed against the buffer material 19, portions of the buffer material 19, which contact the control electrode member 14 and the main electrode member 12 becomes thinner than a portion which does not contact the control electrode member 14 and the main electrode member 12. The buffer material 19 is gradually thinner from the portion which does not contact the control electrode member 14 and the main electrode member 12 toward the portions which contact the control electrode member 14 and the main electrode member 12. Because resin sealing is performed in this state, a shape of the sealing material 17 follows a shape of the buffer material 19. Thus, the sealing material 17 provided on side surfaces of the distal end portions of the main electrode member 12 and the control electrode member 14 has a tapered shape in which a film thickness in a lateral direction in the figure becomes thinner toward the distal end surfaces of the main electrode member 12 or the control electrode member 14.

In a case where there is a difference between linear expansion coefficients of the main electrode member 12 and the control electrode member 14 and a linear expansion coefficient of the sealing material 17, stress occurs between both by a cooling/heating cycle, or the like. If a crack is generated in the sealing material 17 or the sealing material 17 peels due to stress, moisture enters upon a moisture resistance test, or the like, and reaches the semiconductor chip 1, or the like, which shortens the life of the semiconductor device. For that, in the present embodiment, the film thickness of the sealing material 17 is gradually thinner toward the distal end surfaces of the main electrode member 12 or the control electrode member 14 as described above. Thus, stress becomes smaller toward end surfaces of the main electrode member 12 or the control electrode member 14, so that it is possible to prevent the sealing material 17 from peeling from the control electrode member 14 and the main electrode member 12.

Further, in a case where the semiconductor chip 1 incorporates a temperature sensing device or a current sensing device, these devices are often vulnerable to static electricity compared to a main portion. Thus, a surface of the buffer material 19 which contacts the distal end surfaces of the main electrode member 12 and the control electrode member 14 preferably has conductivity. This prevents occurrence of a potential difference between terminals during and after sealing, so that it is possible to prevent overvoltage breakdown of the semiconductor chip 1 by static electricity.

Figure 12:
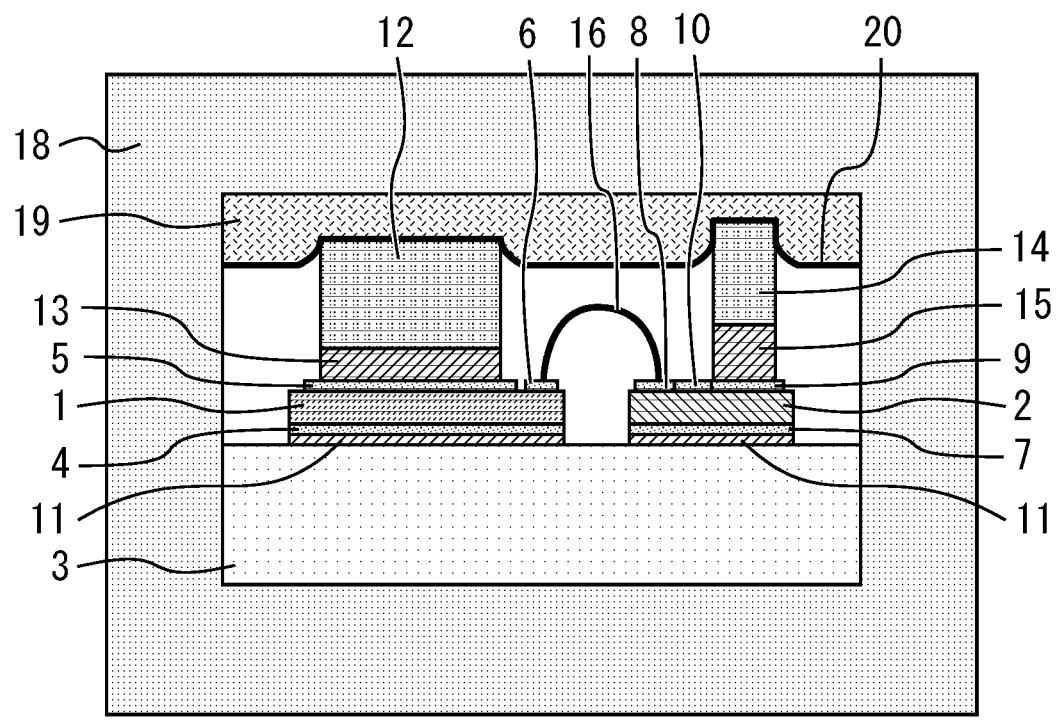
FIG. 12 is a cross-sectional view illustrating a modified example of the manufacturing method of the semiconductor device according to the first embodiment.

FIG. 12 is a cross-sectional view illustrating a modified example of the manufacturing method of the semiconductor device according to the first embodiment. The buffer material 19 includes a resin material which does not have conductivity, and a conductive thin film 20 such as a carbon sheet and a metallic foil provided between the resin material and the main electrode member 12 and between the resin material and the control electrode member 14. The distal end surfaces of the main electrode member 12 and the control electrode member 14 contact the conductive thin film 20, and a potential difference does not occur between terminals, so that it is possible to prevent overvoltage breakdown of the semiconductor chip 1 by static electricity. Further, use of the conductive thin film 20 enables use of an inexpensive sealing material 17 such as Teflon. Alternatively, the buffer material 19 may include carbon as a main component. Such a buffer material 19 has conductivity, so that it is possible to constitute the buffer material 19 with a single member, without using the conductive thin film 20. It is therefore possible to reduce machining cost.

Second Embodiment

Figure 13:
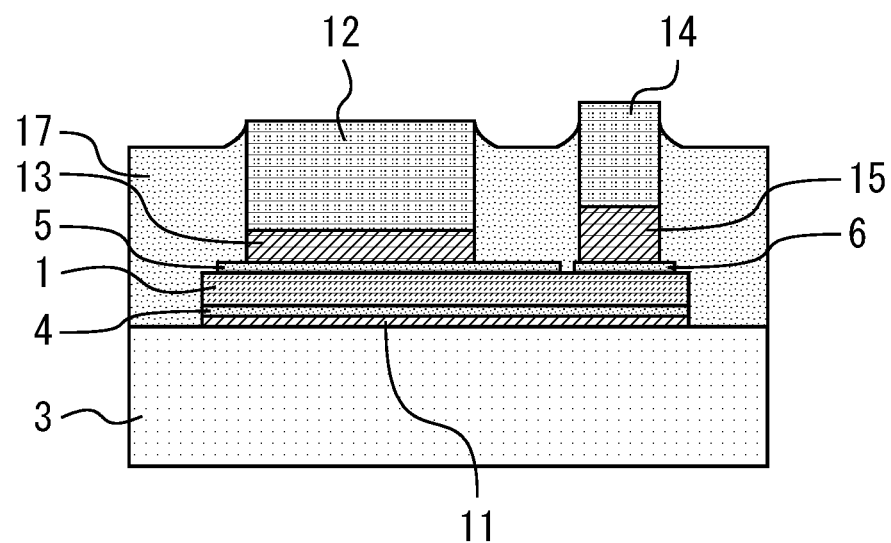
FIG. 13 is a cross-sectional view illustrating a semiconductor device according to a second embodiment.

FIG. 13 is a cross-sectional view illustrating a semiconductor device according to a second embodiment. In the present embodiment, the wiring chip 2 and the connection member 16 are not provided, and the control electrode member 14 is bonded to the control electrode 6 of the semiconductor chip 1 via the second bonding material 15. Other configurations are similar to those in the first embodiment.

Figure 14:
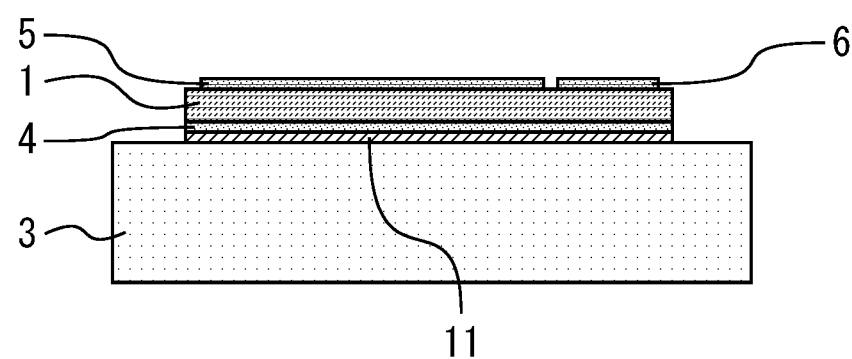
FIG. 14 is a cross-sectional view illustrating the manufacturing method of the semiconductor device according to the second embodiment.
Figure 15:
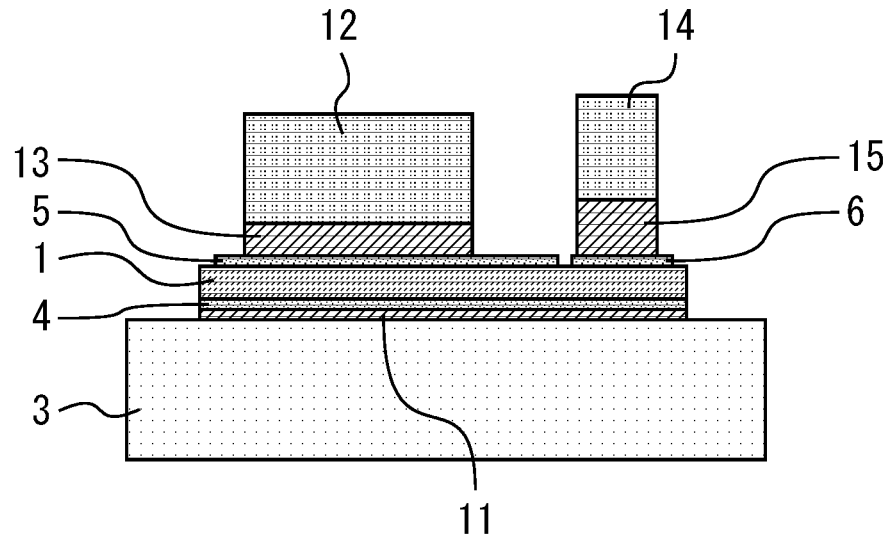
FIG. 15 is a cross-sectional view illustrating the manufacturing method of the semiconductor device according to the second embodiment.
Figure 16:
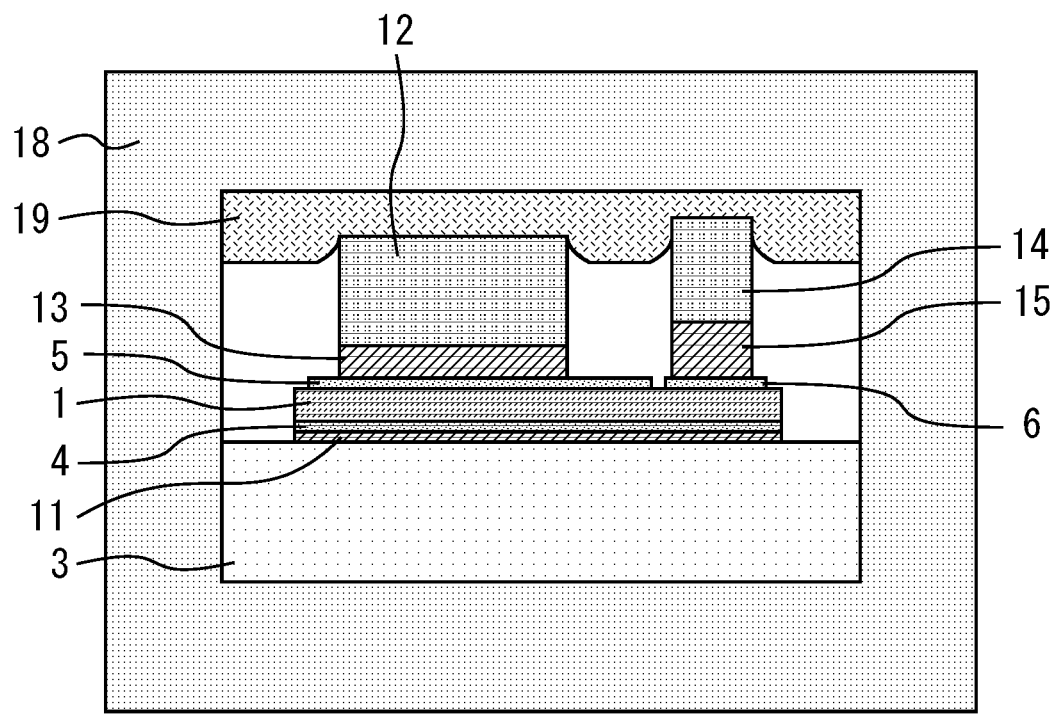
FIG. 16 is a cross-sectional view illustrating the manufacturing method of the semiconductor device according to the second embodiment.

Subsequently, a manufacturing method of the semiconductor device according to the present embodiment will be described. FIGS. 14 to 16 are cross-sectional views illustrating the manufacturing method of the semiconductor device according to the second embodiment. First, as illustrated in FIG. 14, the semiconductor chip 1 is bonded to the substrate 3. Then, as illustrated in FIG. 15, the main electrode member 12 is bonded to the main electrode 5 via the first bonding material 13. The control electrode member 14 is bonded to the control electrode 6 via the second bonding material 15.

Then, as illustrated in FIG. 16, a semi-finished product including the semiconductor chip 1, the substrate 3, the main electrode member 12 and the control electrode member 14, which are bonded, is put into the mold 18. In this event, the buffer material 19 is provided between the main electrode member 12 and the mold 18 and between the control electrode member 14 and the mold 18. The semiconductor chip 1, the substrate 3, the main electrode member 12 and the control electrode member 14 are sealed with the sealing material 17 by injecting the sealing material 17 into the mold 18 in a state where the distal end surfaces of the main electrode member 12 and the control electrode member 14 are pressed against the buffer material 19.

The buffer material 19 is removed from the upper surface of the semiconductor device when the semiconductor device is removed from the mold 18 after sealing. Through the above-described process, the semiconductor device in which the distal end surfaces of the main electrode member 12 and the control electrode member 14 are exposed from the sealing material 17 is manufactured without grinding the sealing material 17. By this means, it is possible to reliably lead the electrode members out of the upper surface of the device while preventing increase in manufacturing cost in a similar manner to the first embodiment. In a case of a semiconductor device such as a semiconductor product having small capacity, which includes less semiconductor chips connected in parallel, there is a case where the present embodiment in which electrodes are individually led out of the semiconductor chip 1 and connected to an external circuit without using the wiring chip 2 is preferable because manufacturing cost can be reduced.

The semiconductor chip 1 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-045845, filed on Mar. 19, 2021 including specification, claims, drawings and summary, on which the convention priority of the present application is based, is incorporated herein by reference in its entirety.

The invention claimed is:

1. A manufacturing method of a semiconductor device comprising:
    bonding a semiconductor chip, which includes a main electrode and a control electrode, to a substrate;
    bonding a wiring chip, which includes a first electrode, a second electrode and a wiring connecting the first electrode and the second electrode, to the substrate;
    bonding a main electrode member to the main electrode via a first bonding material;
    bonding a control electrode member to the second electrode via a second bonding material;
    bonding the control electrode to the first electrode with a connection member;
    putting the semiconductor chip, the substrate, the wiring chip, the main electrode member, the control electrode member and the connection member, which are bonded, into a mold; and
    sealing the semiconductor chip, the substrate, the wiring chip, the main electrode member, the control electrode member and the connection member with sealing material by injecting the sealing material into the mold in a state that distal end surfaces of the main electrode member and the control electrode member are pressed against a buffer material provided between the main electrode member and the mold and between the control electrode member and the mold,
    wherein the sealing material is not ground.

2. The manufacturing method of a semiconductor device according to claim 1, wherein a height of the distal end surface of the bonded main electrode member is different from a height of the distal end surface of the bonded control electrode member.

3. The manufacturing method of a semiconductor device according to claim 1, wherein distal end portions of the main electrode member and the control electrode member protrude from an upper surface of the sealing material, and the sealing material provided on side surfaces of the distal end portions has a tapered shape in which a film thickness becomes thinner toward the distal end surfaces.

4. The manufacturing method of a semiconductor device according to claim 1, wherein a surface of the buffer material which contacts the distal end surfaces of the main electrode member and the control electrode member has conductivity.

5. The manufacturing method of a semiconductor device according to claim 4, wherein the buffer material includes a resin material, and a conductive thin film provided between the resin material and the main electrode member and between the resin material and the control electrode member.

6. The manufacturing method of a semiconductor device according to claim 4, wherein the buffer material includes carbon as a main component.

7. The manufacturing method of a semiconductor device according to claim 1, wherein the semiconductor chip is made of a wide-band-gap semiconductor.

8. The manufacturing method of a semiconductor device according to claim 1, wherein the buffer material is removable from an upper surface of the semiconductor device after removing the semiconductor device from the mold after sealing to expose the distal end surfaces of the main electrode member and the control electrode member.

9. A manufacturing method of a semiconductor device comprising:

bonding a semiconductor chip, which includes a main electrode and a control electrode, to a substrate;

bonding a main electrode member to the main electrode via a first bonding material;

bonding a control electrode member to the control electrode via a second bonding material;

putting the semiconductor chip, the substrate, the main electrode member, and the control electrode member, which are bonded, into a mold; and sealing the semiconductor chip, the substrate, the main electrode member, and the control electrode member with sealing material by injecting the sealing material into the mold in a state that distal end surfaces of the main electrode member and the control electrode member are pressed against a buffer material provided between the main electrode member and the mold and between the control electrode member and the mold, wherein the sealing material is not ground.

10. The manufacturing method of a semiconductor device according to claim 9, wherein a height of the distal end surface of the bonded main electrode member is different from a height of the distal end surface of the bonded control electrode member.

11. The manufacturing method of a semiconductor device according to claim 9, wherein distal end portions of the main electrode member and the control electrode member protrude from an upper surface of the sealing material, and the sealing material provided on side surfaces of the distal end portions has a tapered shape in which a film thickness becomes thinner toward the distal end surfaces.

12. The manufacturing method of a semiconductor device according to claim 9, wherein a surface of the buffer material which contacts the distal end surfaces of the main electrode member and the control electrode member has conductivity.

13. The manufacturing method of a semiconductor device according to claim 12, wherein the buffer material includes a resin material, and a conductive thin film provided between the resin material and the main electrode member and between the resin material and the control electrode member.

14. The manufacturing method of a semiconductor device according to claim 12, wherein the buffer material includes carbon as a main component.

15. The manufacturing method of a semiconductor device according to claim 9, wherein the semiconductor chip is made of a wide-band-gap semiconductor.

16. The manufacturing method of a semiconductor device according to claim 9, wherein the buffer material is removable from an upper surface of the semiconductor device after removing the semiconductor device from the mold after sealing to expose the distal end surfaces of the main electrode member and the control electrode member.

* * * * *